US012016159B2

(12) United States Patent
North et al.

(10) Patent No.: US 12,016,159 B2
(45) Date of Patent: Jun. 18, 2024

(54) COOLING SYSTEM WITH A POROUS FOAM HEAT EXCHANGER AND A POSITIVE DISPLACEMENT AIR PUMP

(71) Applicant: Dell Products L.P., Round Rock, TX (US)

(72) Inventors: Travis C. North, Cedar Park, TX (US); John T. Morrison, Round Rock, TX (US); Laurent Andrew Regimbal, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 178 days.

(21) Appl. No.: 17/454,317

(22) Filed: Nov. 10, 2021

(65) Prior Publication Data

US 2023/0146766 A1    May 11, 2023

(51) Int. Cl.
*H05K 7/20*    (2006.01)
*F28F 13/00*   (2006.01)

(52) U.S. Cl.
CPC ....... *H05K 7/20736* (2013.01); *F28F 13/003* (2013.01)

(58) Field of Classification Search
CPC .................. H05K 7/20736; F28F 13/003
See application file for complete search history.

(56) References Cited

U.S. PATENT DOCUMENTS

| | | | |
|---|---|---|---|
| 7,312,985 B2 * | 12/2007 | Lee .................... | G06F 1/203 |
| | | | 361/679.48 |
| 7,492,588 B2 * | 2/2009 | Hwang ............. | H05K 7/20154 |
| | | | 361/694 |
| 7,987,898 B2 * | 8/2011 | Meng ................. | F04D 29/582 |
| | | | 165/104.34 |
| 8,002,021 B1 * | 8/2011 | Zuo .................... | F28F 13/003 |
| | | | 165/80.4 |
| 10,025,359 B2 * | 7/2018 | Varadarajan ........... | G06F 1/163 |
| 10,939,587 B2 * | 3/2021 | Curtis ................ | H05K 7/20736 |
| 11,151,978 B1 * | 10/2021 | Tseng ................. | G10K 11/161 |
| 11,243,584 B2 * | 2/2022 | Schnell .............. | H05K 7/20727 |
| 11,343,902 B2 * | 5/2022 | He ..................... | H05K 7/20336 |
| 11,432,413 B2 * | 8/2022 | He ...................... | H05K 5/0213 |
| 11,592,882 B2 * | 2/2023 | Nicholas ............. | F28D 15/0208 |
| 11,596,083 B2 * | 2/2023 | Helberg ............. | H05K 7/20272 |
| 11,599,168 B2 * | 3/2023 | McKittrick ....... | H01M 10/6563 |
| 2006/0137862 A1 * | 6/2006 | Huang ................. | H01L 23/427 |
| | | | 165/104.33 |

(Continued)

*Primary Examiner* — Raheena R Malik
(74) *Attorney, Agent, or Firm* — McDermott Will & Emery LLP

(57) ABSTRACT

A cooling system for an information handling system in a portable chassis comprises a vapor chamber for transferring heat away from components, a porous heat exchanger for receiving heat from the vapor chamber, an air pump of receiving airflow at a first air pressure and generating a second airflow at a second air pressure greater than the first airflow. The porous heat exchanger may comprise one of a plurality of sides of an internal air chamber configured to allow the air pump to generate the second air pressure two to three orders of magnitude greater than the first air pressure. An air pump such as a piezoelectric air pump can generate airflow at a pressure that is two to three orders of magnitude greater than possible using a traditional blower.

11 Claims, 4 Drawing Sheets

(56) References Cited

U.S. PATENT DOCUMENTS

| | | | | |
|---|---|---|---|---|
| 2007/0267172 | A1* | 11/2007 | Hwang | H01L 23/467 |
| | | | | 257/E23.099 |
| 2009/0008066 | A1* | 1/2009 | Meng | F28F 13/003 |
| | | | | 415/177 |
| 2017/0307308 | A1* | 10/2017 | Baldwin | H01L 23/3733 |
| 2018/0088636 | A1* | 3/2018 | Varadarajan | G06F 1/163 |
| 2018/0235106 | A1* | 8/2018 | Curtis | H05K 7/20145 |
| 2020/0141661 | A1* | 5/2020 | Pitzak | F28F 1/30 |
| 2021/0345502 | A1* | 11/2021 | He | H05K 9/0041 |
| 2021/0373624 | A1* | 12/2021 | Schnell | H05K 7/20136 |
| 2021/0382532 | A1* | 12/2021 | Nicholas | G06F 1/203 |
| 2022/0015222 | A1* | 1/2022 | He | H05K 7/20163 |
| 2023/0035904 | A1* | 2/2023 | McKittrick | H01M 10/6563 |
| 2023/0146766 | A1* | 5/2023 | North | F28F 3/12 |
| | | | | 165/80.4 |

* cited by examiner

COOLING SYSTEM WITH A POROUS FOAM HEAT EXCHANGER AND A POSITIVE DISPLACEMENT AIR PUMP

BACKGROUND

Field of the Disclosure

This disclosure relates generally to systems for cooling components and portable chassis of information handling systems and, more particularly, to cooling systems with positive displacement air pumps and porous heat exchangers.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Natural convective cooling is limited to 3.5 W in a 13 inch form factor and radiation accounting for close to another 3.5 W.

SUMMARY

Embodiments disclosed herein may be generally directed to information handling systems and cooling systems for cooling components in a portable information system portable chassis.

Embodiments may be directed to a cooling system for an information handling system in a portable chassis. The cooling system may include a positive displacement pump and one or more porous heat exchangers.

A vapor chamber comprises a vapor chamber first surface and a vapor chamber second surface, wherein at least one of the vapor chamber first surface and the vapor chamber second surface is in contact with one or more heat generating components in the chassis. A porous heat exchanger is in sealed contact with the vapor chamber and an air pump is in sealed contact with the porous heat exchanger, the air pump comprising an air pump first surface having an air pump inlet and an air pump second surface opposite the first surface, the air pump second surface having an air pump outlet. An internal air chamber is defined by the air pump second surface, the vapor chamber first surface and a plurality of sides, wherein at least one side comprises the porous heat exchanger. The vapor chamber conducts heat away from the one or more heat generating components to the porous heat exchanger, the air pump draws a first airflow at a first air pressure into the air pump inlet and generates a second airflow at a second air pressure in the internal air chamber, whereby the second airflow at the second pressure is forced through the porous heat exchanger, and the porous heat exchanger transfers heat from the vapor chamber to the second airflow.

In some embodiments, contact between the air pump second surface and the plurality of sides comprises sealed contact. In some embodiments, the sealed contact comprises a gasket positioned between the porous heat exchanger and the air pump. In some embodiments, the sealed contact between the porous heat exchanger and the vapor chamber comprises a gasket.

In some embodiments, the porous heat exchanger is positioned relative to a vent of the chassis, wherein the second airflow is forced through the porous heat exchanger to the ambient environment.

In some embodiments, the cooling system comprises two porous heat exchangers, wherein the internal air chamber comprises the plurality of sides, wherein at least two sides comprise the two porous heat exchangers. In some embodiments, a first porous heat exchanger is positioned relative to a first vent on a first cover of the chassis and a second porous heat exchanger is positioned relative to a second vent on a second cover of the chassis. In some embodiments, a first porous heat exchanger is positioned relative to a first vent on the chassis and a second porous heat exchanger is positioned relative an internal region of the chassis. In some embodiments, the first porous heat exchanger comprises a first porosity and the second porous heat comprises a second porosity.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
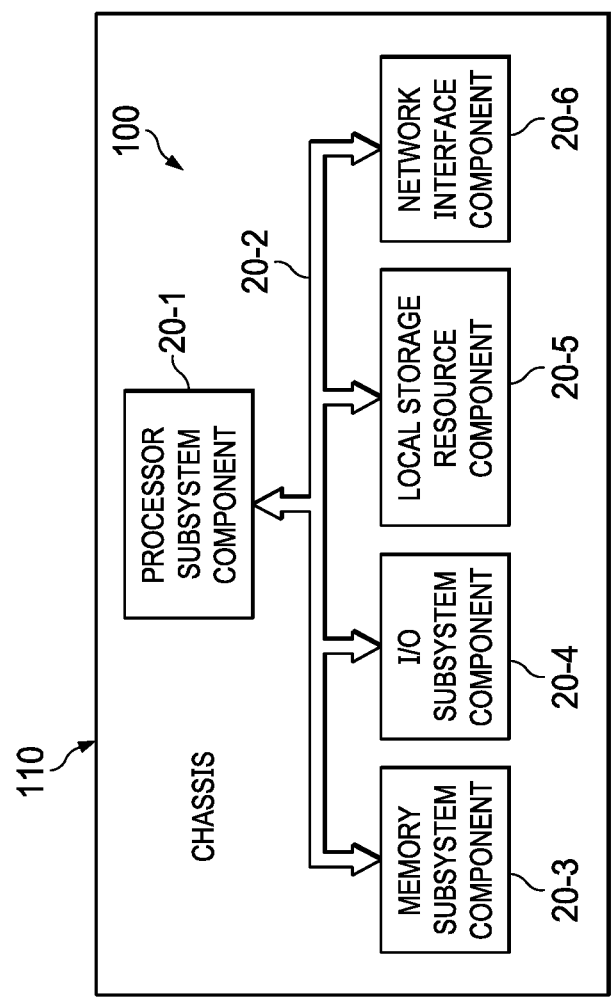
FIG. 1 depicts a block diagram of an information handling system in a portable chassis.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, heat exchanger "206-1" refers to an instance of a heat exchanger, which may be referred to collectively as heat exchangers "206" and any one of which may be referred to generically as heat exchanger "206."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Embodiments disclosed herein include a cooling system comprising a vapor chamber for removing heat from a set of heat generating components in the chassis, a porous heat exchanger coupled to the vapor chamber for receiving heat from the vapor chamber, a positive displacement air pump for generating an air flow with high air pressure. A gasket or other barrier isolates the air pump inlet from the air pump outlet. The air pump is capable of generating a large pressure differential between the air inlet and the air pump outlet whereby air in the internal air chamber is forced through the heat exchanger. In some embodiments, the air pump is capable of generating a second airflow with a second air pressure at least two orders of magnitude greater than atmospheric air pressure. In some embodiments, the air pump is capable of generating a second airflow with a second air pressure at least two orders of magnitude greater than an air pressure that a traditional blower fan is capable of providing.

Embodiments may be configured for positioning in areas in which heat pipes do not provide enough heat transfer or traditional blower fans cannot generate enough airflow or a fan generates airflow but with high noise level.

Embodiments disclosed herein are described with respect to an information handling system contained in a portable chassis. Particular embodiments are best understood by reference to FIGS. 1-5, wherein like numbers are used to indicate like and corresponding parts.

Turning to the drawings, FIG. 1 depicts a block diagram of an information handling system 100 in a portable chassis 110.

Information handling system 100 may contain components 20-1 of a processor subsystem comprising a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, components 20-1 of a processor subsystem may interpret and execute program instructions and process data stored locally (e.g., in a memory subsystem). In the same or alternative embodiments, components of a processor subsystem may interpret and execute program instructions and process data stored remotely (e.g., in a network storage resource).

Information handling system 100 may contain components 20-3 of a memory subsystem comprising a system, device, or apparatus operable to retain and retrieve program instructions and data for a period of time (e.g., computer-readable media). Components 20-3 of a memory subsystem may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

Information handling system 100 may contain components 20-4 of an input/output (I/O) subsystem comprising a system, device, or apparatus generally operable to receive and transmit data to or from or within information handling system 100. Components 20-4 of an I/O subsystem may represent, for example, a variety of communication interfaces, graphics interfaces, video interfaces, user input interfaces, and peripheral interfaces. In various embodiments, components 20-4 of an I/O subsystem may be used to support various peripheral devices, such as a touch panel, a display adapter, a keyboard, a touch pad, or a camera, among other examples. In some implementations, components 20-4 of an I/O subsystem may support so-called 'plug and play' connectivity to external devices, in which the external devices may be added or removed while information handling system 100 is operating.

Information handling system 100 may contain components 20-5 of a local storage resource comprising computer-readable media (e.g., hard disk drive, floppy disk drive, CD-ROM, and other type of rotating storage media, flash memory, EEPROM, or another type of solid-state storage media) and may be generally operable to store instructions and data.

Information handling system 100 may contain components 20-6 of a network interface comprising a suitable system, apparatus, or device operable to serve as an interface between information handling system 100 and a network (not shown). Components 20-6 of a network interface may enable information handling system 100 to communicate over a network using a suitable transmission protocol or standard. In some embodiments, components 20-6 of a network interface may be communicatively coupled via a network to a network storage resource (not shown). A network coupled to components 20-6 of a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to components 20-6 of a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to components 20-6 of a network interface or various components associated therewith may be implemented using hardware, software, or any combination thereof.

Information handling system 100 may contain components 20-2 of a system bus comprising any of a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In some embodiments of information handling system 100 installed in a portable chassis 110 such as a laptop or tablet, a component 20 may generate heat that must be transferred to the ambient environment. If the component 20 does not generate much heat, a traditional blower fan may be capable of generating airflow to remove the heat. However, as components 20 increase in processing capabilities, they use more power and generate more heat. Removal of heat using a traditional fan would require a larger fan size, which might not fit in a portable chassis with a smaller thickness or may require the fan to rotate at higher speeds, which increases noise.

Embodiments disclosed herein increase cooling capabilities within a portable chassis 110 with an air pump that can generate airflow with a pressure two to three orders of magnitude higher than a traditional blower fan. Where a traditional blower utilizes a rotating impeller to deliver airflow, embodiments disclosed herein may take advantage of positive displacement and piezoelectric air pumps to generate extremely large pressure heads at a power conversion ratio that may be three times the pressure head of traditional fans. Embodiments may also operate beyond the threshold of hearing. Embodiments may further comprise a combination of a unique vapor chamber structure in combination with a porous metal foam heat sink, including a porous metal foam heat exchanger.

Embodiments may incorporate any one or combination of the following aspects: an air pump in a portable chassis that draws air in the portable chassis; a vapor chamber with integrated porous foam located at the edge of the dedicated air pump and encompassing the entire air pump; an exhaust port impinging upon a dedicated vapor chamber on the opposite side of the intake to the air pump; and a gasketed seat where the air pump is sealed within the pocket of the porous foam structure.

Air Pump Increases Air Pressure to Force Air Through a Porous Heat Exchanger

Figure 2:
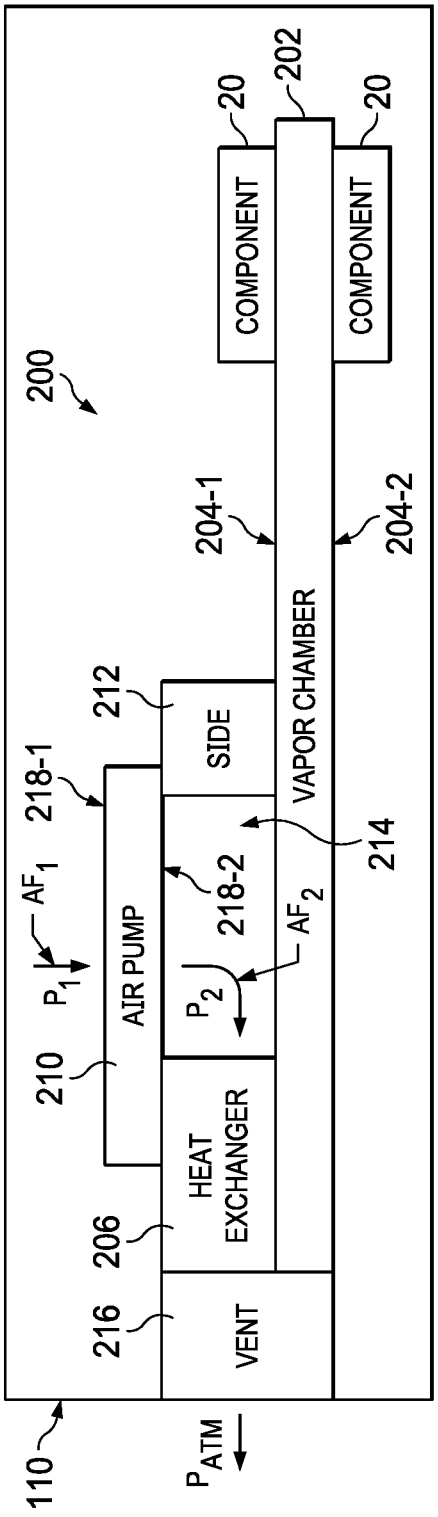
FIG. 2 depicts a side cutaway view of one embodiment of a cooling system for an information handling system in a portable chassis, illustrating an internal air chamber formed by sealed contact between a vapor chamber, an air pump and a plurality of sides including a porous heat exchanger.
Figure 3:
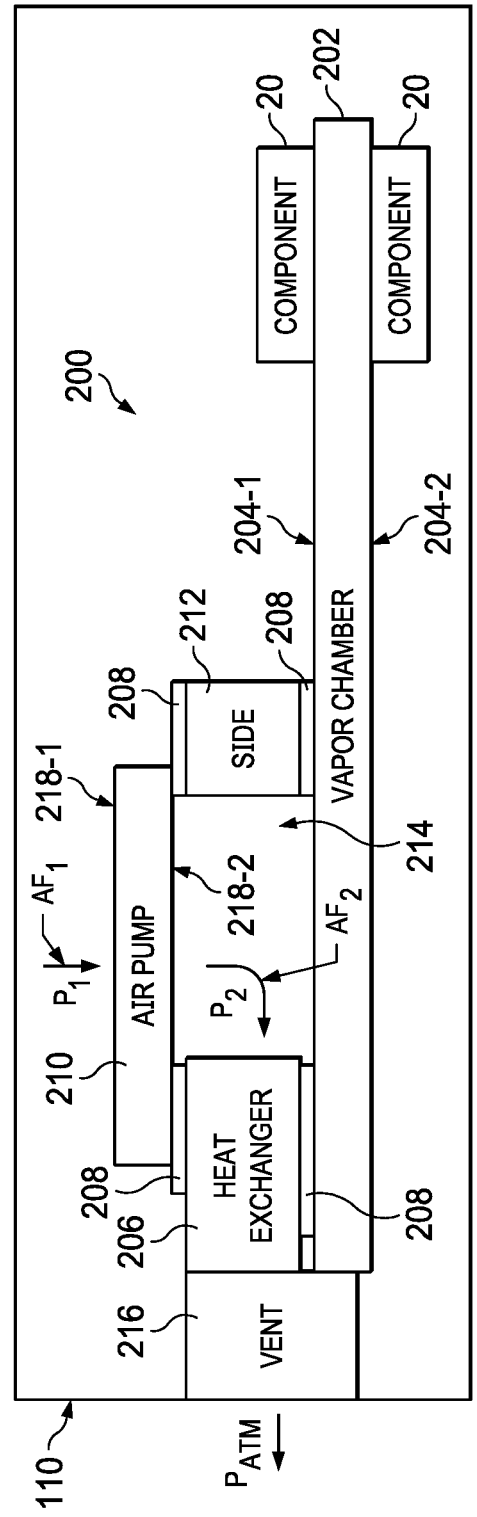
FIG. 3 depicts a side cutaway view of one embodiment of a cooling system for an information handling system in a portable chassis, illustrating an internal air chamber formed with a gasket ensuring sealed contact between a vapor chamber, an air pump and a plurality of sides including a porous heat exchanger.

FIGS. 2 and 3 are cutaway side views of embodiments of a cooling system for cooling selected components of information handling system 100 in a portable chassis 110.

As depicted in FIG. 2, embodiments of cooling system 200 comprise vapor chamber 202, porous heat exchanger 206 and air pump 210, wherein vapor chamber 202, a plurality of sides 212 including porous heat exchanger 206 and air pump 210 define an internal air chamber 214, wherein a first airflow ($AF_1$) enters air pump 210 at a first air pressure $P_1$, air pump 210 generates a second airflow ($AF_2$) in internal air chamber 214 at a second air pressure $P_2$ that is greater than $P_1$ such that air is forced out porous heat exchanger 206 through vent 216 to the ambient environment at an ambient air pressure $P_{ATM}$.

Vapor chamber 202 comprises a first surface 204-1 and a second surface 204-2, wherein at least one of first surface 204-1 and second surface 204-2 is thermally coupled with one or more components 20 that generate heat during operation and at least one of first surface 204-1 and second surface 204-2 is thermally coupled with porous heat exchanger 206. Vapor chamber 202 is configured to transfer heat away from heat generating components 20 and conduct heat to porous heat exchanger 206.

Heat exchanger 206 may comprise a porous material with an associated porosity. The porosity of heat exchanger 206 and the second air pressure $P_2$ may determine the volumetric flow rate of airflow through heat exchanger 206. In some embodiments, heat exchanger 206 may have a porosity greater than 65%. In some embodiments, heat exchanger 206 may have a porosity greater than 75%. In some embodiments, heat exchanger 206 may have a porosity greater than 80%. In some embodiments, heat exchanger 206 may be formed from a porous metal foam.

Sealed Contact Ensures Airflow Goes Through the Heat Exchanger

Referring to FIGS. 2 and 3, air pump 210 comprises an air inlet 218-1 on a first side and an air outlet 218-2 on a second side opposite the first side 218-1. Air pump 210 is configured to receive first airflow $AF_1$ at a first air pressure $P_1$ through air inlet 218-1 and generate a second airflow $AF_2$ at a second air pressure $P_2$ that is higher than the first air pressure. In some embodiments, air pump 210 is capable of generating the second airflow $AF_2$ with second air pressure $P_2$ two to three magnitudes higher than first air pressure $P_1$. In some embodiments, air pump 210 comprises a positive displacement air pump. In some embodiments, air pump 210 comprises a piezoelectric air pump. An advantage to using a piezoelectric air pump 210 is the ability to operate beyond the threshold of human hearing and thus cool components 20 quieter than a traditional fan blower. Although not shown, some embodiments may include a filter element for prefiltering air before the air enters the air pump inlet.

As depicted in FIG. 2, a first side of porous heat exchanger 206 may be directly coupled to first side 204-1 of vapor chamber 202, wherein the coupling between porous heat exchanger 206 and vapor chamber 202 comprises sealed contact. A second side of porous heat exchanger 206 may be directly coupled to second side 218-2 of air pump 210, wherein the coupling between porous heat exchanger 206 and air pump 210 comprises sealed contact. As used herein, the term "sealed contact" may refer to any coupling between heat exchanger 206 and vapor chamber 202 and/or air pump 210 such that air does not flow between heat exchanger 206 and vapor chamber 202 and/or between heat exchanger 206 and air pump 210. In some embodiments, a porous metal foam heat exchanger 206 may be bonded, brazed or chemically attached to vapor chamber 202.

As depicted in FIG. 3, a first side of porous heat exchanger 206 may be coupled to first side 204-1 of vapor chamber 202 using gasket 208, wherein gasket 208 ensures the coupling between porous heat exchanger 206 and vapor chamber 202 comprises sealed contact. A second side of porous heat exchanger 206 may be coupled to second side 218-2 of air pump 210 using gasket 208, wherein gasket 208 ensures the coupling between porous heat exchanger 206 and air pump 210 comprises sealed contact. Gasket 208 may be formed as a single gasket or may comprise multiple gaskets 208. For example, a first gasket 208 may ensure sealed contact between heat exchanger 206 and air pump 210 and a second gasket 208 may ensure sealed contact between vapor chamber 202 and heat exchanger 206. Gasket 208 may ensure air pump inlet is separated or isolated from an air pump outlet.

Internal air chamber 214 may be defined by first surface 204-1 of heat exchanger 202, second surface 218-2 of air pump 210 and a plurality of sides 212, wherein at least one side comprises heat exchanger 206. Air pump 210 draws in airflow $AF_1$ at first air pressure $P_1$ and generates second airflow $AF_2$ with second air pressure $P_2$ greater than $P_1$. In some embodiments, internal air chamber 214 is capable of containing second air pressure $P_2$ that is 2-3 orders of magnitude than air pressure $P_1$. In doing so, second air pressure $P_2$ may force second airflow $AF_2$ through porous heat exchanger 206, wherein heat is transferred from porous heat exchanger 206 to airflow $AF_2$. Second airflow $AF_2$ may then flow out vent 216 to the ambient environment. In some embodiments, vent 216 may be located on a rear cover of chassis 110. In some embodiments, vent 216 may be located on a side cover of chassis 110.

Heat Exchanger Positioning Directs Second Airflow Out Chassis

Figure 4:
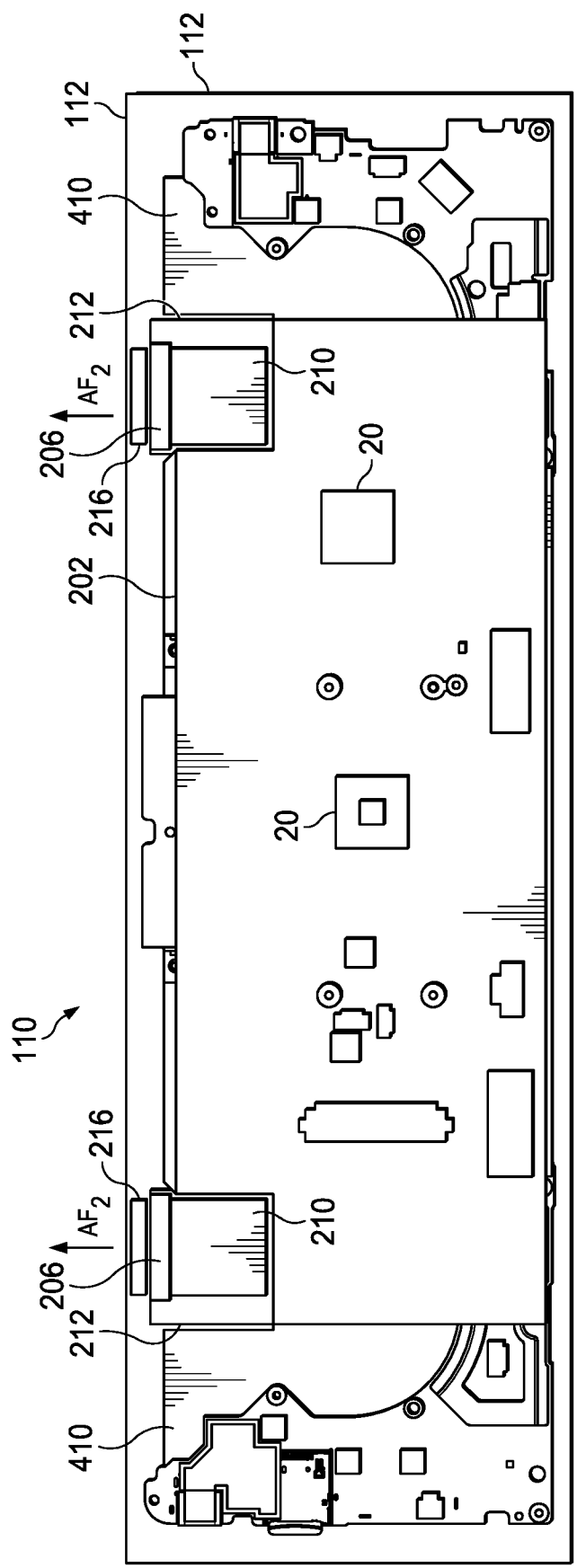
FIG. 4 depicts a top partial view of one embodiment of a cooling system for an information handling system in a portable chassis, illustrating air flow through a single heat exchanger.

Referring to FIG. 4, in some embodiments, cooling system 200 may be positioned in chassis 110 such that vent 216 is proximate a rear cover of chassis 110. In some embodiments, chassis 110 may include fan 410, wherein fan 410 may provide a third airflow $AF_3$ for cooling components 20 in chassis 110. A controller (not shown) may execute instructions to operate one or more of cooling system 200 and fan 410 to cool components 20 in chassis 110 based on a temperature of one or more components 20 and a noise level associated with fan 410. In some embodiments (not shown) cooling system 200 may be configured such that vent 216 is located on a side cover of chassis 110.

Figure 5:
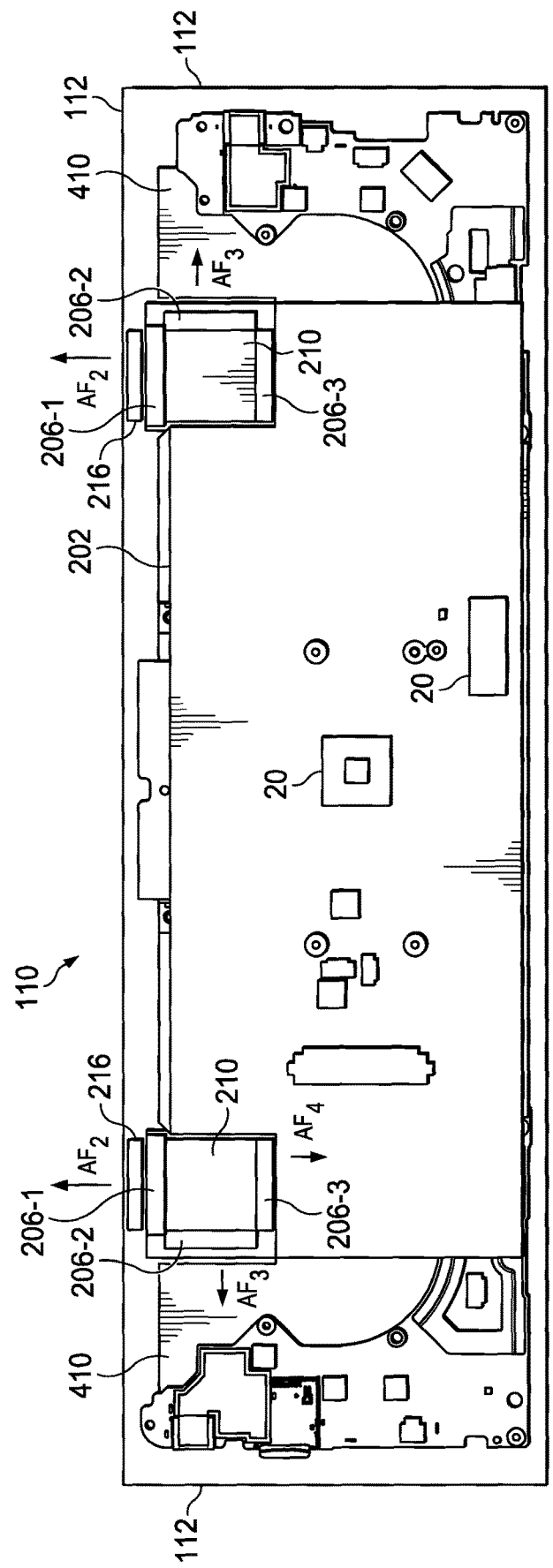
FIG. 5 depicts a top partial view of one embodiment of a cooling system for an information handling system in a portable chassis, illustrating air flow through multiple heat exchangers.

Multiple Heat Exchanger Positioning Directs Second Airflow Out Chassis and Third Airflow into Chassis Referring to FIG. 5, in some embodiments, cooling system 200 may comprise two or more heat exchangers 206 and be positioned in chassis 110 such that a first heat exchanger 206-1 is positioned proximate vent 216 near a rear cover of chassis 110 and second heat exchanger 206-2 is positioned such that a third airflow ($AF_3$) exits second heat exchanger 206-2 and enters chassis 110. In some embodiments, chassis 110 may include fan 410, wherein fan 410 may provide a fourth airflow $AF_4$ for cooling components 20 in chassis 110 and airflow $AF_4$ generated by fan 410 may mix with and cause third airflow $AF_3$ to exit chassis 110. A controller (not shown) may execute instructions to operate one or more of cooling system 200 and fan 410 to cool components 20 in chassis 110 based on a temperature of one or more components 20 and a noise level associated with fan 410. In some embodiments (not shown) cooling system 200 may be configured such that vent 216 is located on a side cover of chassis 110.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A cooling system for an information handling system in a portable chassis, the cooling system comprising:
   a vapor chamber comprising a vapor chamber first surface and a vapor chamber second surface, wherein at least one of the vapor chamber first surface and the vapor chamber second surface is in contact with one or more heat generating components in the chassis;
   a first porous heat exchanger in sealed contact with the vapor chamber;
   a second porous heat exchanger;
   an air pump in sealed contact with the first porous heat exchanger, the air pump comprising an air pump first surface having an air pump inlet and an air pump second surface opposite the first surface, the air pump second surface having an air pump outlet; and
   an internal air chamber comprising a plurality sides, the internal air chamber defined by the air pump second surface, the vapor chamber first surface and the plurality of sides, wherein at least one side comprises the first porous heat exchanger and at least another side comprises the second porous heat exchanger, wherein:
   the vapor chamber is configured to conduct heat away from the one or more heat generating components to the first porous heat exchanger,
   the air pump is configured to draw a first airflow at a first air pressure into the air pump inlet and generate a second airflow out the air pump second surface at a second air pressure in the internal air chamber, whereby the second pressure forces the second airflow through the first porous heat exchanger, and
   the first porous heat exchanger is configured to transfer heat from the vapor chamber to the second airflow; and
   a vent configured to allow the second airflow to exit to the ambient environment,
   wherein the first porous heat exchanger is positioned relative to the first vent on the chassis and the second porous heat exchanger is positioned relative an internal region of the chassis.

2. The cooling system of claim 1, wherein contact between the air pump second surface and the plurality of sides comprises sealed contact.

3. The cooling system of claim 2, wherein the sealed contact comprises a gasket positioned between the porous heat exchanger and the air pump.

4. The cooling system of claim 2, wherein the sealed contact between the porous heat exchanger and the vapor chamber comprises a gasket.

5. The cooling system of claim 1, wherein the second airflow is forced through the first porous heat exchanger to the ambient environment.

6. The cooling system of claim 1, wherein the first porous heat exchanger comprises a first porosity and the second porous heat exchanger comprises a second porosity.

7. The method of claim 6, comprising positioning a gasket between the air pump second surface and the plurality of sides to form the sealed contact.

8. A method of manufacturing a cooling system for an information handling system in a portable chassis, the method comprising:
   positioning a vapor chamber in the chassis, the vapor chamber comprising a vapor chamber first surface and a vapor chamber second surface, wherein positioning the vapor chamber in the chassis causes contact between at least one of the vapor chamber first surface and the vapor chamber second surface with one or more components of the information handling system in the chassis;

positioning a first porous heat exchanger in sealed contact with the vapor chamber;

positioning a second porous heat exchanger relative to an internal region of the chassis; and positioning an air pump in sealed contact with a plurality of sides of an internal air chamber, the air pump comprising an air pump first surface having an air pump inlet and an air pump second surface opposite the first surface, the air pump second surface having an air pump outlet, wherein the plurality of sides comprises the first porous heat exchanger as one side, wherein the vapor chamber first surface, the air pump second surface and the plurality of sides form the internal air chamber, wherein another side of the plurality of sides comprises the second porous heat exchanger, wherein the vapor chamber conducts heat away from the one or more components of the information handling system to the first porous heat exchanger, the air pump draws a first airflow into the air pump inlet at a first air pressure and generates a second airflow at a second air pressure in the internal air chamber that is higher than the first air pressure, whereby the second airflow is forced through the first porous heat exchanger, and the first porous heat exchanger transfers heat from the vapor chamber to the second airflow, wherein the first porous heat exchanger is positioned relative to a first vent on the chassis.

9. The method of claim 8, comprising positioning the gasket between the porous heat exchanger and the air pump second surface to form the sealed contact.

10. The method of claim 8, wherein the first porous heat exchanger comprises a first porosity and the second porous heat exchanger comprises a second porosity.

11. A portable chassis for an information handling system comprising a plurality of components that generate heat during processing instructions, the portable chassis comprising:

a vapor chamber comprising a vapor chamber first surface and a vapor chamber second surface, wherein at least one of the vapor chamber first surface and the vapor chamber second surface is in contact with one or more of the plurality of heat generating components in the chassis;

a first porous heat exchanger in sealed contact with the vapor chamber;

a second porous heat exchanger;

an air pump in sealed contact with the porous heat exchanger, the air pump comprising an air pump first surface having an air pump inlet and an air pump second surface opposite the air pump first surface, the air pump second surface having an air pump outlet;

an internal air chamber comprising a plurality sides, the internal air chamber defined by the air pump second surface, the vapor chamber first surface and plurality of sides, wherein at least one side comprises the first porous heat exchanger and at least another side comprises the second porous heat exchanger; and a cover comprising a vent, wherein:

the vapor chamber is configured to conduct heat away from the one or more heat generating components to the first porous heat exchanger, the air pump is configured to draw a first airflow at a first air pressure into the air pump inlet and generate a second airflow out the air pump second surface at a second air pressure in the internal air chamber, whereby the second pressure forces the second airflow through the first porous heat exchanger, and the first porous heat exchanger is configured to transfer heat from the vapor chamber to the second airflow; and the vent is configured to allow the second airflow to exit to the ambient environment, wherein the first porous heat exchanger is positioned relative to the first vent on the chassis and the second porous heat exchanger is positioned relative an internal region of the chassis.

* * * * *